United States Patent [19]

Miller

[11] Patent Number: 5,091,328
[45] Date of Patent: Feb. 25, 1992

[54] METHOD OF LATE PROGRAMMING MOS DEVICES

[75] Inventor: William E. Miller, Los Gatos, Calif.

[73] Assignee: National Semiconductor Corporation, Santa Clara, Calif.

[21] Appl. No.: 440,516

[22] Filed: Nov. 21, 1989

[51] Int. Cl.⁵ ............... H01L 21/70; H01L 21/00
[52] U.S. Cl. .................................... 437/52; 437/41; 437/45; 437/48; 437/51; 437/145; 437/150; 437/162; 357/23.12
[58] Field of Search ............... 437/145, 150, 162, 51, 437/41, 45, 48, 52; 357/23.12

[56] References Cited

U.S. PATENT DOCUMENTS

| | | | |
|---|---|---|---|
| 4,356,042 | 10/1982 | Gedaly et al. | 437/45 |
| 4,467,520 | 8/1984 | Shiotari | 437/52 |
| 4,513,494 | 4/1985 | Batra | 437/48 |
| 4,818,716 | 4/1989 | Okuyama et al. | 437/49 |
| 4,837,181 | 6/1989 | Galbiati et al. | 437/48 |

Primary Examiner—Brian E. Hearn
Assistant Examiner—Kevin Picardat
Attorney, Agent, or Firm—Limbach, Limbach & Sutton

[57] ABSTRACT

Method for late programming of MOS integrated circuit devices. A second or third level conductive layer is used as a device selection mask for transporting dopant from a doped gate (formed from a first level conductive layer) into the channel region of selected field effect transistors.

30 Claims, 4 Drawing Sheets

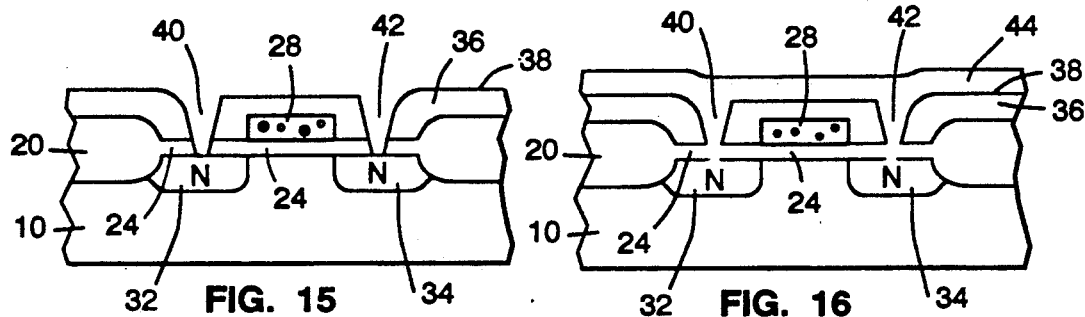
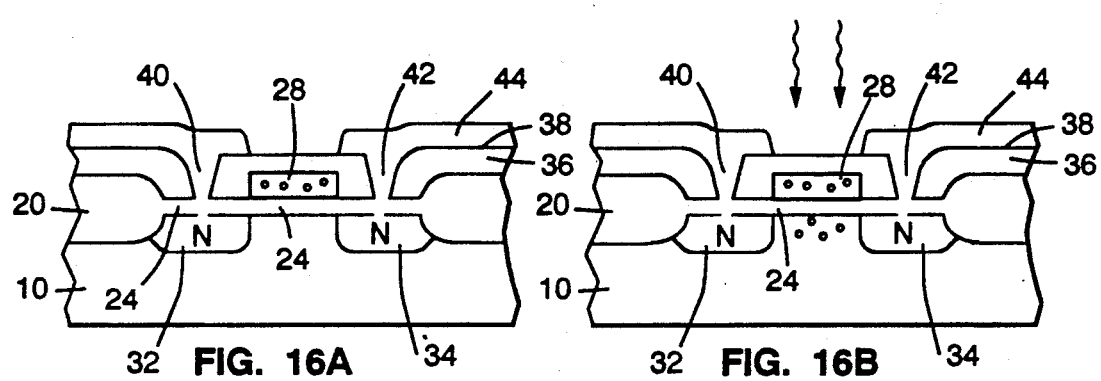
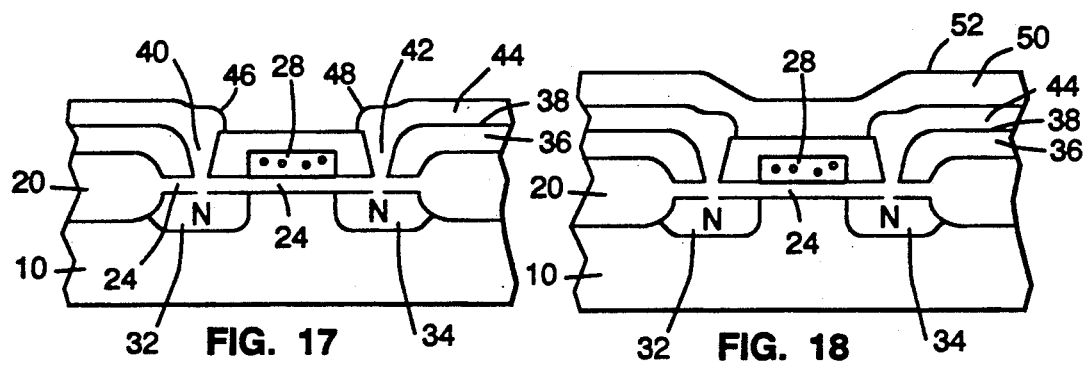

METHOD OF LATE PROGRAMMING MOS DEVICES

BACKGROUND OF THE INVENTION

1. Field of the Invention

The present invention relates to information storage systems and, in particular, to a method for late programming of MOS integrated circuit devices.

2. Discussion of the Art

The principal modern method for fabricating semiconductor integrated circuits is the so-called planar process. The planar process relies on the unique characteristics of silicon and comprises a complex sequence of manufacturing steps involving deposition, oxidation, photolithography, diffusion and/or ion implantation, and metallization, to fabricate a "layered" integrated circuit device in a silicon substrate.

For example, oxidation of a crystalline silicon substrate results in the formation of a layer of silicon dioxide on the substrate surface. Photolithography can then be used to selectively pattern and etch the silicon dioxide layer to expose a portion of the underlying substrate. These openings in the silicon dioxide layer allow for the introduction ("doping") of ions ("dopant") into defined areas of the underlying silicon. The silicon dioxide acts as a mask; that is, doping only occurs where there are openings. Careful control of the doping process and of the type of dopant allows for the creation of localized areas of different electrical resistivity in the silicon. The particular placement of acceptor ion-doped (positive free hole, "p") regions and donor ion-doped (negative free electron, "n") regions in large part defines the interrelated design of the transistors, resistors, capacitors and other circuit elements on the silicon wafer. Electrical interconnection and contact to the various p or n regions that make up the integrated circuit is made by a deposition of a thin film of conductive material, usually aluminum or polysilicon, thereby finalizing the design of the integrated circuit.

Of course, the particular fabrication process and sequence used will depend on the desired characteristics of the semiconductor device. Today, one can choose from among a wide variety of devices and circuits to implement a desired digital or analog logic feature.

Where it is desired to have semiconductor devices with uncommitted logic gates such that the final logic configuration of the device is determined by the end user, the fabrication process must allow for programming of the device. Programming normally involves adjusting threshold voltages of particular gate transistors located either in or out of a memory row and column matrix. If the memory matrix is formed utilizing MOS depletion type transistors, then programming involves reduction of the threshold voltage of selected transistors to below a predetermined operating voltage level for the matrix. Threshold reduction is achieved by doping the region of the selected depletion devices utilizing ions of a conductivity type the same as that of the MOS transistor's source and drain. If on the other hand, the memory matrix is formed utilizing enhancement type MOS transistors, then programming selectively raises, not reduces, the threshold voltage of the selected transistors above a predetermined operating voltage level for the matrix. Threshold increases are achieved by introducing into the channel region ions of a conductivity type opposite to that of the MOS transistor's source and drain.

Because later steps in the fabrication process can affect characteristics introduced in earlier steps in the process, logic programming is most commonly and easily achieved during an early wafer processing step. Early programming generally presents no design inconveniences for the bulk manufacturing of standard semiconductor devices. On the other hand, where it is desired to produce more unique or "customized" devices, early programming results in unacceptably long fabrication cycle time from the programming step to the shipment date. For faster turnaround, there is a need to program as late in the fabrication sequence as possible, so that few, if any, steps separate the unprogrammed chip from shipment.

Attempts have been made to provide for programming of logic later in the fabrication cycle. Uniformly, such late programming methods utilize ion implantation to adjust the channel voltage thresholds. In general, the variations among these late programming methods involve the number of layers through which ion implantation is performed. In one case, for example, very high energy ion implantation is performed to penetrate many layers and great thickness of materials. In another case, low energy ion implantation is performed after etching a deep hole in the deposited layers.

There are a number of problems with the ion implantation approach to late programming. Most importantly, there is the problem of metallization over the region to be doped. Metallization will block and prevent proper ion implantation. Furthermore, even if metallization can be avoided in the physical area of ion implant, achieving doping at the required depth requires an ion implantation instrument with very high ion beam energy (approximately 1 MEV), high dose (approximately $10^{14}$ cm$^{-2}$) and high throughput capacity. Ion implant equipment required to meet these requirements is extremely expensive and not production proven.

The approach of etching a deep hole down through the successive device layers would allow, of course, for the use of an ion implantation instrument of lower ion beam energy (approximately 360 KEV). Unfortunately, this solution is not practical. First, the cutting must avoid all other metallization (lateral error). Second, the cutting must stop precisely before the region to be doped (vertical error). Thirdly, metallization cannot be routed over the region after doping without further passivation.

Therefore, it would be highly desirable to have available a method for programming integrated circuits without the need for expensive and specialized equipment. Furthermore, it would be highly desirable to have available a method for programming integrated circuits after metallization.

SUMMARY OF THE INVENTION AND OBJECTS

It is a general object of the present invention to provide a method for the late programming of integrated circuits.

It is another object of the present invention to provide a method for late programming of integrated circuit chips that is relatively inexpensive.

It is another object of the present invention to provide a method for late programming of integrated circuit chips that allows for short fabrication cycle times.

In general, the above and other objects of the invention are achieved by the following method. First, a field effect MOS transistor is formed on a silicon wafer, having a channel region defined by a source and drain, self-aligned to a gate formed from a first level conductive layer. In a preferred embodiment, the first level conductive layer is doped with dopant prior to the time the channel region is defined. In another embodiment, the gate is formed and then doped with dopant in a subsequent step. Next, a first insulating layer, having an upper surface, is deposited over the field effect transistor. Contact windows in the first insulating layer are opened up over the source and drain. A second level conductive layer is deposited on the upper surface of first insulating layer thereby filling the contact windows to make a low resistance electrical connection with the source and drain.

In one embodiment of the present invention, late programming can be carried out at this point. If a selected device is to be programmed, a late programming window is opened up in the second level conductive layer over the doped gate and the dopant from the doped gate is transported into the channel region of the field effect transistor that is beneath the programming window. In one embodiment, the method further comprises, after transporting dopant into the channel region, the additional step of etching the second level conductive layer to create interconnect.

In a preferred embodiment of the present invention, late programming is carried out at a later point. In this embodiment, formation of the second level conductive layer is followed by the deposition of a second insulating layer, having an upper surface. Next, an initial third level conductive layer is deposited on the upper surface of the second insulating layer. At this point in this preferred embodiment, if a selected device is to be programmed, late programming is carried out by opening a late programming window in the initial third level conductive layer over the doped gate and there dopant from the doped gate is transported into the channel region of the field effect transistor. In one embodiment, the method further comprises, after transporting the dopant into the channel region, the additional step of etching the initial third level conductive layer to create interconnect. In another embodiment, the method further comprises, after transporting the dopant into the channel region, the additional steps of stripping the initial third level conductive layer, depositing a final third level conductive layer, and etching the final third level conductive layer to create interconnect.

In a preferred embodiment, the transporting of dopant from the doped gate into the channel region of the field effect transistor comprises diffusion in the presence of a diffusion enhancer. In one embodiment, the dopant is of a conductivity type opposite to that of the source and drain. In another embodiment, the dopant is the same conductivity type as that of the source and drain. In a preferred embodiment, the dopant comprises boron ions and the diffusion enhancer comprises hydrogen.

The present invention contemplates, in a preferred embodiment, that the gate is doped with one or more dopants, including a selected dopant. The steps of fabrication are carried out until the point where late programming is desired. When a device is to be late programmed, the selected dopant is transported in the channel region of the field effect transistor. In this preferred embodiment, it is contemplated that the selected dopant is either of a conductivity type opposite to that of the source and drain, or the same conductivity type as that of the source and drain. In a preferred embodiment, the selected dopant comprises boron ions.

BRIEF DESCRIPTION OF THE DRAWINGS

FIGS. 1-21 are a schematic representation of sequential processing steps of a method of late programming in accordance with the present invention.

DESCRIPTION OF A PREFERRED EMBODIMENT

Figure 1:
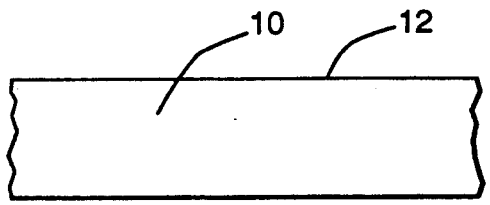

FIG. 1 shows a portion of a silicon substrate 10 on which a field effect transistor (FET) is to be formed and later programmed. The FET is one of many such FETs to be integrally formed in a repetitive pattern on a monocrystalline silicon wafer (not shown) of which the substrate portion 10 is a part. The wafer and therefore the substrate 10 would typically be homogeneous and would be of p or n type resistivity. Of course, the particular resistivity will depend on the desired electrical characteristics of the finished devices. The preferred wafer thickness is ordinarily a function of the wafer diameter.

Figure 2:
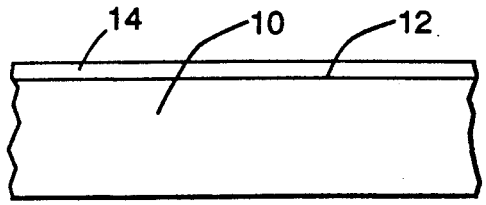

The upper surface 12 of the silicon wafer containing substrate 10 is lapped, polished and cleaned in the normal and accepted manner. A thin layer 14 of silicon dioxide, preferably between 200–600 Angstroms thick is then formed on surface 12 of substrate 10 as shown in FIG. 2.

Figure 3:
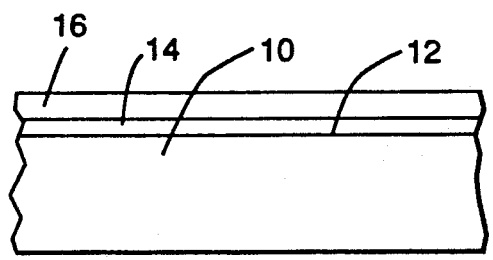

FIG. 3 shows the wafer surface after a blanket layer of silicon nitride ($Si_3N_4$) 16 has been deposited over the silicon dioxide layer 14. The manner in which the silicon nitride layer 16 is deposited and etched is not particularly critical to this invention. Any of the normal and accepted techniques can be used.

Figure 4:
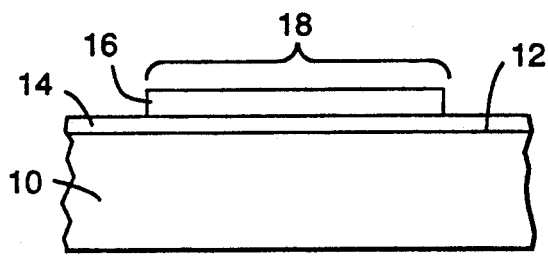
Figure 5:
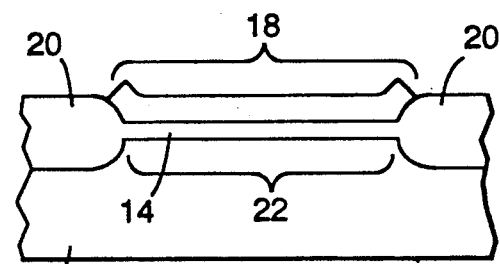

After depositing the blanket silicon nitride layer 16, the layer is etched photolithographically to leave a nitride mask 18 over the area under which the FET is to be formed (FIG. 4). Silicon dioxide field layers 20 of about 0.5 to 1.0 micrometers thick are then thermally grown to isolate active device regions underlying the nitride 18 (FIG. 5). The nitride mask 18 prevents further oxide growth over the oxide pad 22. That is, the field oxide regions 20 subdivide the wafer into a number of active regions and provides an effective diffusion mask for the later processing steps.

Figure 6:
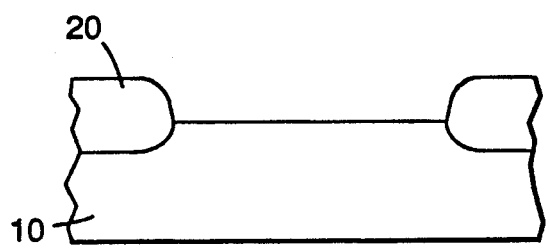
Figure 7:
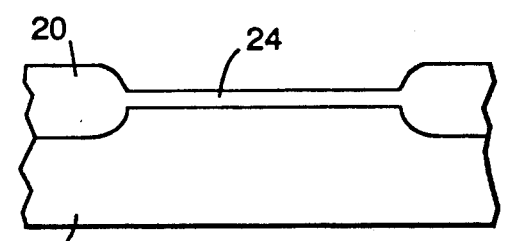

Following the growth of the field oxide 20, the nitride mask 18 and the oxide pad 22 are stripped (FIG. 6) and a layer of gate oxide 24 is grown according to conventional techniques (FIG. 7). The gate oxide 24 is preferably between 200 and 400 Angstroms in thickness. (The selected thickness of the gate oxide 24 will determine how much dopant is needed in later processing steps.)

Figure 8:
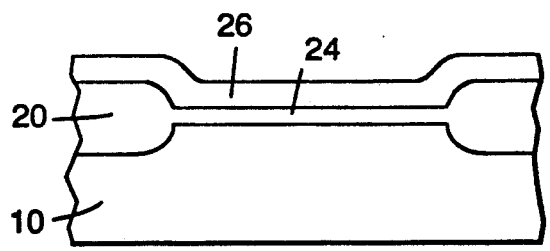

Next, as shown in FIG. 8, a first level conductive layer 26 is deposited on the field oxide 20 and gate oxide 24. The first level conductive layer can be made of any of the following materials: semiconductor singular (Si or Ge) or compound (GaAs), semiconductor metal compound (metal silicide or disilicide, $WSi_2$, $PdSi_2$) or metal singular or compound (W, Pt, Mo, Pd). It is desired that the first level conductive layer be less reflective to radiant heat energy than the subsequent conductive layers. The preferred material for the first level conductive layer is polysilicon.

The first level conductive layer 26 can be formed by chemical vapor deposition, evaporation, sputtering or the like. In general, it would have a thickness of about 4000 Angstroms.

Figure 8A:
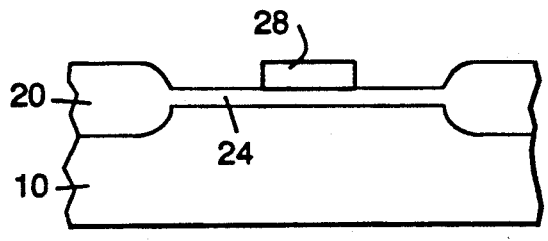
Figure 8B:
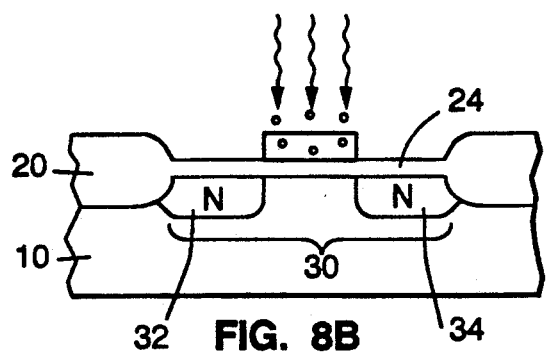
Figure 8C:
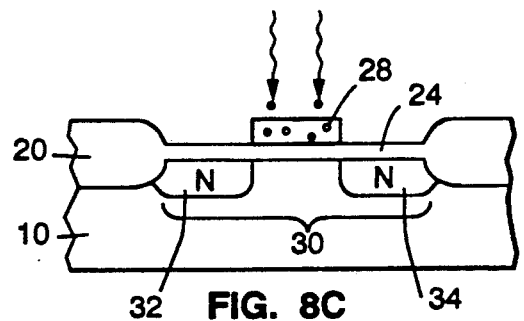
Figure 9:
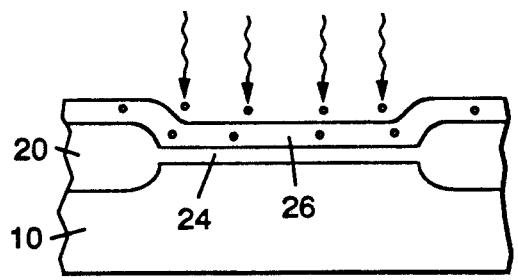

The present invention contemplates that the first level conductive layer 26 is doped before (e.g. sputtered), during (e.g. chemical vapor deposition) or immediately after this step (e.g. chemical vapor deposition). The latter is preferred (FIG. 9). On the other hand, the present invention also contemplates that the first level conductive layer 26 is undoped, i.e. intrinsic, as deposited; it is then etched photolithographically to from a gate 28 and subsequently doped sequentially with dopant (FIGS. 8A, 8B and 8C).

Figure 10:
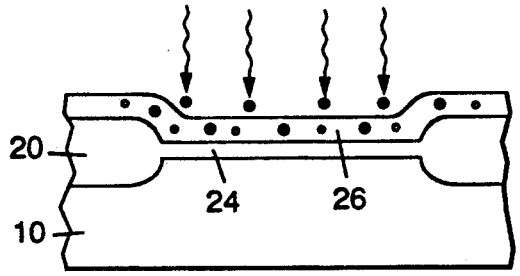

In a preferred embodiment, the first level conductive layer 26 is doped with one or more dopants, including a selected dopant. Referring now to FIGS. 9 and 10, in accordance with a preferred embodiment, the first level conductive layer 26 is sequentially doped with two dopants. For example, the first level conductive layer 26 is doped with phosphorus as a first dopant (FIG. 9, open circles) and then with boron (the selected dopant) as a second dopant (FIG. 10, closed circles). Both dopants are diffused into the first level conductive layer 26. With diffusion doping, the gate oxide 24 prevents doping of the underlying single crystal layers 10. A number of diffusion techniques can be employed. For example, a predeposition step can be followed by drive-in diffusion.

Regardless of the predeposition method used, predeposition is usually carried out such that the surface concentration of the dopant corresponds to the solid solubility of the ion. To drive the dopant into the gate, further high-temperature heat treatment can be employed in a gas which does not contain any other dopant.

Figure 11:
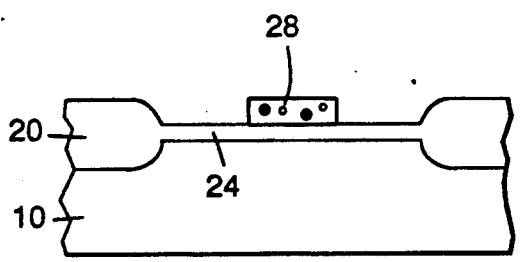

Referring now to FIG. 11, the doped first level conductive layer 26 is photolithographically etched to define a gate 28. There are a number of accepted etching techniques. However, the particular manner in which the gate 28 is defined forms no part of this invention.

Figure 12:
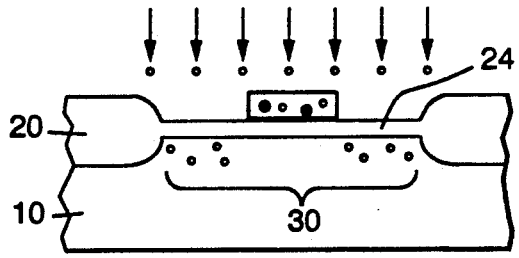
Figure 13:
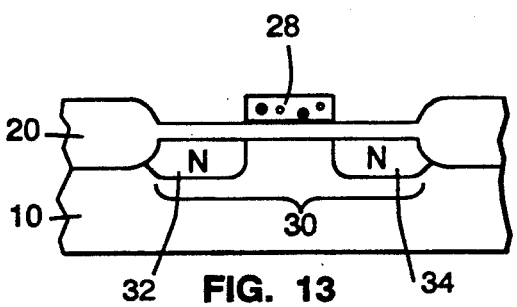

Referring to FIGS. 12 and 13, a standard FET 30 is then created with an implanted source 32 and drain 34, self-aligned to the gate 28 formed from the first conductive layer 26. That is, the source 32 and drain 34 regions are made by ion implantation (FIG. 10) using the gate 28 as a mask. In order to form a FET 30 by ion implantation, the surface of the substrate 10 must be given a dopant implant (e.g. phosphorus, arsenic or antimony) in a dosage such that the final concentration is approximately $10^{20}$ dopants per $cm^3$.

Figure 14:
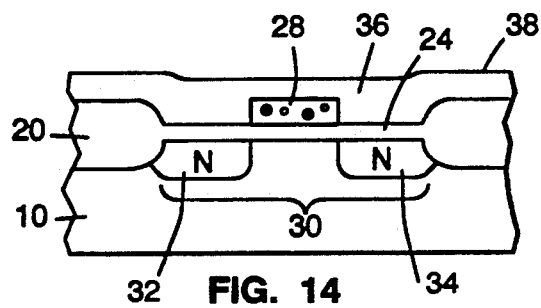

Referring to FIG. 14, a first relatively thick insulating layer 36 is deposited. Typically, the first insulating layer 36 is made of silicon dioxide. However, the present invention contemplates employing any of the known and accepted practices and insulating materials used to passivate and smooth out the surface of semiconductor devices. Where silicon dioxide is used, the wafer is heated to reflow the silicon dioxide and provide a smooth upper surface 38. First insulating layer 36 can be deposited in any convenient manner, as for example by chemical vapor deposition. The minimum thickness of first insulating layer 36 which is needed to smooth out the upper surface 38 will vary. However, a thickness of about 5000-10,000 Angstroms is preferred.

First insulating layer 36 is then photolithographically masked to open contact windows (40 and 42) in it over the source 32 and drain 34 regions (FIG. 15). In the photolithographic technique, first insulating layer 36 is etched in the normal and accepted manner. Any other contacts needed for the resultant circuitry on the substrate 10 can also be opened while windows 40 and 42 are opened. However, first insulating layer 36 is otherwise left continuous over the FET 30.

A second level conductive layer 44 is then formed on the upper surface 38 of first insulating layer 36 as shown in FIG. 16. Any of the normal and accepted metals and methods of forming the layer can be used. For example, the layer 44 can be formed by evaporating a blanket layer of aluminum onto the entire upper surface 38. Layer 44 fills the contact windows 40 and 42 to make a low resistance electrical connection with the source 32 and drain 34 regions. Conductive substances other than pure aluminum can be used in forming the conductive layer 44, such as aluminum-silicon alloy, tungsten, titanium, alone or in a multiplicity of layers, as is known and acceptable.

Layer 44 can be photolithographically etched in a normal and accepted manner to define source and drain electrodes 46 and 48 as shown in FIG. 17. In one embodiment, the present invention contemplates programming at this point. However, it is preferred that programming be performed at a later step (see below). If programming is desired at this point, the present invention contemplates the following steps: i) opening programming windows in layer 44 (FIG. 16A), and ii) transporting dopant from the doped gate 28 into the channel region of the FET 30 (FIG. 16B). In a preferred embodiment, where the gate 28 is doped with one or more dopants, including the selected dopant, the selected dopant is transported into the channel region of the FET 30. The methods for carrying out steps i) and ii) are more fully described below for late programming after formation of a third level conductive layer.

A second insulating layer 50 having upper surface 52 may be deposited on layer 44 (FIG. 18). Second insulating layer 50, like first insulating layer 36, can be deposited in any convenient manner, as for example by chemical vapor deposition. Again, the present invention contemplates employing any of the known and accepted practices and insulating materials. The minimum thickness of second insulating layer 50 will vary. However, a thickness of about 5000-10,000 Angstroms is preferred.

At this point, the present invention contemplates two alternative process flows for late programming. Flow I involves i) forming an initial third level conductive layer 54 to serve as a mask and as interconnect (FIG. 19), ii) opening late programming windows by photomasking and etching (FIG. 20), iii) transporting dopant into the channel region of the FET (FIG. 21), and iv) photomasking and etching interconnect. Flow II involves i) forming an initial third level conductive layer as a mask (FIG. 19), ii) opening late programming windows by photomasking and etching (FIG. 20), iii) transporting dopant into the channel region of the FET (FIG. 21), iv) stripping off the initial third level conductive layer 54 (FIG. 21A), v) depositing a final third conductive layer 57 (FIG. 21B), and vi) photomasking and etching interconnect. Because Flow II involves stripping of the initial third level conductive layer metal mask, it is contemplated that the final third level conductive layer metal interconnect can be over the window areas. By contrast, the metal interconnect of Flow I will not be over the window areas since the metal is not redeposited.

Figure 19:
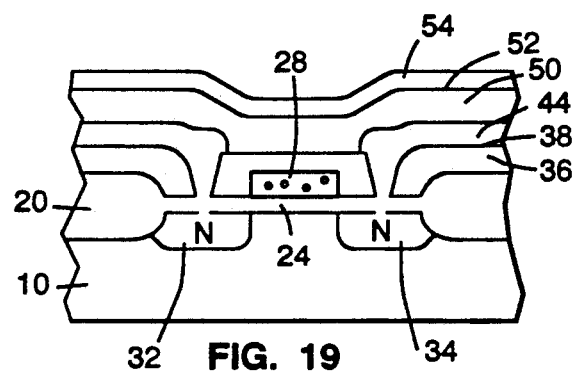

Thus, for Flow I and Flow II late programming, an initial third level conductive layer 54 is formed on the upper surface 52 of second insulating layer 50 as shown in FIG. 19. Again, any of the normal and accepted metals and methods of forming layer 54 can be used. For example, layer 54 can be formed by evaporating a blanket layer of aluminum onto the entire upper surface 52 of second insulating layer 50.

Figure 20:
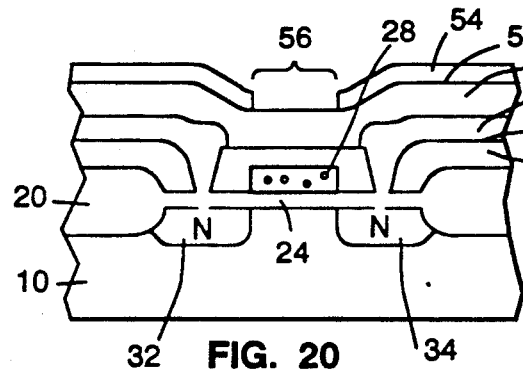
Figure 21:
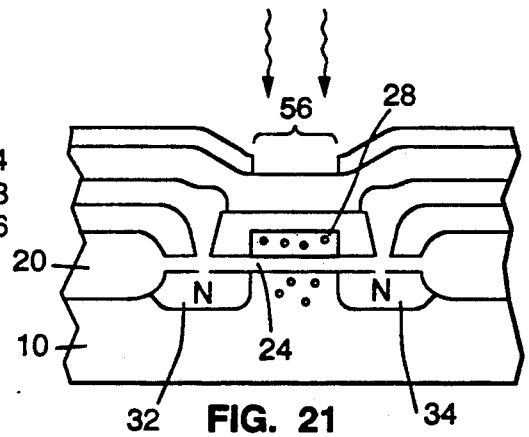
Figure 21A:
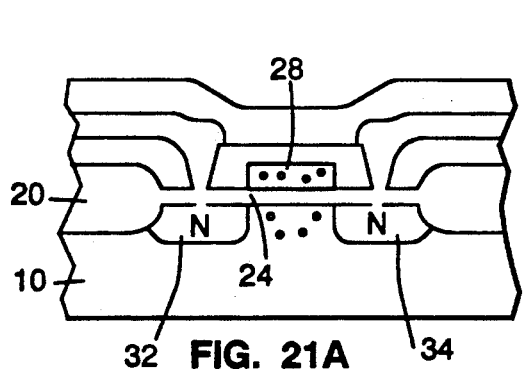
Figure 21B:
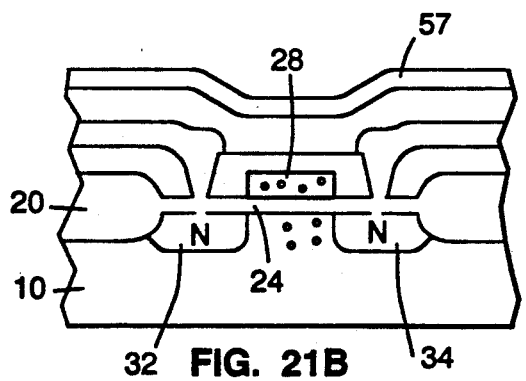

Layer 54 is photolithographically etched to open late programming window 56 as shown in FIG. 20. In this manner, layer 54 is used as a mask to serve as a reflector of radiation heating used in late programming according to the method of the present invention.

The late programming method of the present invention contemplates programming the device by diffusing dopant from the doped gate 28 through the gate oxide 24 (FIG. 21) into the channel region of the FET 30. In a preferred embodiment, where the gate 28 is doped with one or more dopants, including a selected dopant, it is contemplated that the selected dopant (e.g. boron) is transported from the doped gate 28 into the channel region of the FET 30.

It is contemplated that diffusion of the programming dopant from the gate 28 through the gate oxide 24 into the channel region of the FET 30 is achieved by the application of heat and the presence of diffusion enhancers (e.g. hydrogen for a boron dopant). Since the programming must be selective to only program the desired transistors, either heat or the enhancer must be applied selectively, or both must be applied selectively.

Selective Heating

Selective heating is possible according the methods of the present invention by virtue of the initial third level conductive layer 54 having windows 56 etched into it over the gate 28 uncovering the transistors desired to be programmed. Radiant heat energy (from Rapid Thermal Anneal equipment for example) would be transmitted through these windows and absorbed as heat in the gate 28. Outside the windows, the initial third level conductive layer would reflect the heat.

In one embodiment of the method of the present invention, heat would be applied by treating the gate area with 700° C. for 10 minutes. In another embodiment, the gate area is treated with 900° C. for 1 minute. Importantly, areas outside of the window area must be maintained below a critical temperature depending on the type of second level conductive layer and silicon contact utilized. For example:

1. Aluminum (1 to 2% silicon) interconnect with alloy contacts has a practical limit of 500° C. for 30 minutes (Al-Si alloy eutectic melt temperature is 577° C).
2. Aluminum interconnect with a barrier metal (e.g. titanium nitride) in the contacts has a practical limit of 650° C. for 10 minutes (Aluminum melts at 660° C.).
3. Refractory metal interconnect (e.g. tungsten) with a barrier metal (e.g. titanium nitride) in the contacts has a practical limit of 950° C. for 30 minutes.

In general, for heat application times greater than approximately 1 minute, it may be necessary to provide a source of cooling via the back side of the wafer to keep areas outside the window area from getting overheated.

Diffusion Enhancers

Selective application of diffusion enhancers is also contemplated by the present invention. The enhancer is applied by use of the same initial third level conductive layer 54 with the same windows 56 etched into it. One enhancer contemplated by the present invention is hydrogen. Hydrogen greatly enhances the boron diffusion from the doped gate 28 through the gate oxide to the channel region of the FET 30.

Programming

As noted above, programming involves adjusting threshold voltages of particular MOS transistors typically located in a programmable read only memory, row and column matrix. By introducing boron into the channel region of the FET 30, threshold changes are achieved. It is to be noted, however, that, while the memory matrix of the preferred embodiment is made up of enhancement type transistors and programming that selectively raises the threshold voltage of the selected transistors above a predetermined operating voltage for the matrix, the method of the present invention is applicable to a memory matrix having depletion type programming. The relationships of programming and matrix device type contemplated by the present invention can be illustrated by way of example:

| Gate Condition | Channel Formation | ROM Matrix Device Type | |
|---|---|---|---|
| | | N-Channel | P-Channel |
| Always off | Hard Enhancement | +7.0 v | −7.0 v |
| Off/On | Regular Enhancement | ↑ +0.8 v | ↓ −0.8 v |
| Always On | Depletion | ↑ −2.5 v | ↓ +2.5 v |

Thus, programming by introduction of a p-type dopant such as boron into an N-channel will increase the threshold voltage ( ↑ ). On the other hand, programming by introduction of a p-type dopant into a P-channel will reduce the threshold voltage ( ↓ ). (The opposite relationship exists for n-type dopants.)

From the description above it is clear that, in the method of the present invention, the late programming "event" occurs much later than in any late programming method heretofore described. Programming can be delayed not only until after the second level conductive layer is deposited (i.e. "first metallization"); programming can be delayed until after the initial third level conductive layer is deposited (i.e. "second metallization"). In this manner, more unique or "customized" devices can be manufactured without the accompanying unacceptably long fabrication cycle times from the programming step to the shipment date.

One unique feature of the present invention is that the dopant used for late programming is put into the MOS device gate at an early fabrication step, in a convenient location, and by a very low cost method. (The preferred dopant is boron which is typically used in conventional MOS processing.) Similarly, the programming is then selectively accomplished at a late processing step by a low cost method without disturbing the interconnect and insulating layers between the gate and the final interconnect.

With respect to low cost, it should be noted that the method of the present invention require no specialized equipment to dope the channel. This is in contrast to existing late programming methods that require high energy ion implantation equipment.

What is claimed is:

1. A method for late programming integrated circuits, comprising the steps:

a) forming on a silicon wafer, a field effect transistor, having a channel region defined by a source and drain, self-aligned to a gate formed from a first level conductive layer that is doped with dopant;
b) depositing a first insulating layer, having an upper surface, over said field effect transistor;
c) opening contact windows in said first insulating layer over said source and said drain;
d) depositing a second level conductive layer on said upper surface of first insulating layer thereby filling said contact windows to make a low resistance electrical connection with said source and said drain;
e) opening a late programming window in said second level conductive layer over said doped gate; and
f) transporting said dopant from said doped gate into said channel region of said field effect transistor.

2. A method as recited in claim 1 further comprising, after step f), the additional step of etching said second level conductive layer to create interconnect.

3. A method for late programming integrated circuits, comprising the steps:
a) forming on a silicon wafer, a field effect transistor, having a channel region defined by a source and drain, self-aligned to a gate formed from a first level conductive layer that is doped with dopant;
b) depositing a first insulating layer, having an upper surface, over said field effect transistor;
c) opening contact windows in said first insulating layer over said source and said drain;
d) depositing a second level conductive layer on said upper surface of first insulating layer thereby filling said contact windows to make a low resistance electrical connection with said source and said drain;
e) said second level conductive layer is etched to define source and drain electrodes;
f) depositing a second insulating layer, having an upper surface;
g) depositing an initial third level conductive layer on said upper surface of said second insulating layer;
h) opening a late programming window in said initial third level conductive layer over said doped gate; and
i) transporting said dopant from said doped gate into said channel region of said field effect transistor.

4. A method as recited in claim 3 further comprising, after step h), the additional step of etching said initial third level conductive layer to create interconnect.

5. A method as recited in claim 3 further comprising, after step h), the additional steps of:
g) stripping said initial third level conductive layer;
h) depositing a final third level conductive layer; and
i) etching said final third level conductive layer to create interconnect.

6. A method for late programming integrated circuits, comprising the steps:
a) forming on a silicon wafer, a field effect transistor, having a channel region defined by a source and drain, self-aligned to a gate formed from a first level conductive layer;
b) doping said gate with dopant;
c) depositing a first insulating layer, having an upper surface, over said field effect transistor;
d) opening contact windows in said first insulating layer over said source and said drain;

e) depositing a second level conductive layer on said upper surface of first insulating layer thereby filling said contact windows to make a low resistance electrical connection with said source and said drain;
f) opening a late programming window in said second level conductive layer over said doped gate; and
g) transporting said dopant from said doped gate into said channel region of said field effect transistor.

7. A method as recited in claim 6 further comprising, after step g), the additional step of etching said second level conductive layer to create interconnect.

8. A method for late programming integrated circuits, comprising the steps:
a) forming on a silicon wafer, a field effect transistor, having a channel region defined by a source and drain, self-aligned to a gate formed from a first level conductive layer;
b) doping said gate with dopant;
c) depositing a first insulating layer, having an upper surface, over said field effect transistor;
d) opening contact windows in said first insulating layer over said source and said drain;
e) depositing a second level conductive layer on said upper surface of first insulating layer thereby filling said contact windows to make a low resistance electrical connection with said source and said drain;
f) said second level conductive layer is etched to define source and drain electrodes;
g) depositing a second insulating layer, having an upper surface;
h) depositing an initial third level conductive layer on said upper surface of said second insulating layer;
i) opening a late programming window in said initial third layer conductive layer over said doped gate; and
j) transporting said dopant from said doped, gate into said channel region of said field effect transistor.

9. A method as recited in claim 8 further comprising, after step i), the additional step of etching said initial third level conductive layer to create interconnect.

10. A method as recited in claim 8 further comprising, after step i), the additional steps of:
j) stripping said initial third level conductive layer;
k) depositing a final third level conductive layer; and
l) etching said final third level conductive layer to create interconnect.

11. A method as recited in claims 1, 2, 3, 4, 5, 6, 7, 8, 9 or 10 wherein said transporting of dopant from said doped gate into said channel region of said field effect transistor comprises diffusion in the presence of a diffusion enhancer.

12. A method as recited in claim 11 wherein said dopant is of a conductivity type opposite to that of said source and said drain.

13. A method as recited in claims 11 wherein said dopant is the same conductivity type as that of said source and said drain.

14. A method as recited in claim 11 wherein said dopant comprises boron ions.

15. A method as recited in claim 14 wherein said diffusion enhancer comprises hydrogen.

16. A method for late programming integrated circuits, comprising the steps:
a) forming on a silicon wafer, a field effect transistor, having a channel region defined by a source and drain, self-aligned to a gate formed from a first level conductive layer that is doped with one or more dopants, including a selected dopant;

b) depositing a first insulating layer, having an upper surface, over said field effect transistor;

c) opening contact windows in said first insulating layer over said source and said drain;

d) depositing a second level conductive layer on said upper surface of first insulating layer thereby filling said t windows to make a low resistance electrical on with said source and said drain;

e) opening a late programming window in said second level conductive layer over said doped gate; and f) transporting said selected dopant from said doped gate into said channel region of said field effect transistor.

17. A method as recited in claim 16 further comprising, after step f), the additional step of etching said second level conductive layer to create interconnect.

18. A method for late programming integrated circuits, comprising the steps:

a) forming on a silicon wafer, a field effect transistor, having a channel region defined by a source and drain, self-aligned to a gate formed from a first level conductive layer that is doped with one or more dopants, including a selected dopant;

b) depositing a first insulating layer, having an upper surface, over said field effect transistor;

c) opening contact windows in said first insulating layer over said source and said drain;

d) depositing a second level conductive layer on said upper surface of first insulating layer thereby filling said contact windows to make a low resistance electrical connection with said source and said drain;

e) said second level conductive layer is etched to define source and drain electrodes;

f) depositing a second insulating layer, having an upper surface;

g) depositing an initial third level conductive layer on said upper surface of said second insulating layer;

h) opening a late programming window in said initial third level conductive layer over said doped gate; and i) transporting said selected dopant from said doped gate into said channel region of said field effect transistor.

19. A method as recited in claim 18 further comprising, after step h), the additional step of etching said initial third level conductive layer to create interconnect.

20. A method as recited in claim 18 further comprising, after step h), the additional steps of:

g) stripping said initial third level conductive layer;
h) depositing a final third level conductive layer; and
i) etching said final third level conductive layer to create interconnect.

21. A method for late programming integrated circuits, comprising the steps:

a) forming on a silicon wafer, a field effect transistor, having a channel region defined by a source and drain, self-aligned to a gate formed from a first level conductive layer;

b) doping said gate with one or more dopants, including a selected dopant;

c) depositing a first insulating layer, having an upper surface, over said field effect transistor;

d) opening contact windows in said first insulating layer over said source and said drain;

e) depositing a second level conductive layer on said upper surface of first insulating layer thereby filling said contact windows to make a low resistance electrical connection with said source and said drain;

f) opening a late programming window in said second level conductive layer over said doped gate; and g) transporting said selected dopant from said doped gate into said channel region of said field effect transistor.

22. A method as recited in claim 21 further comprising, after step g), the additional step of etching said second level conductive layer to create interconnect.

23. A method for late programming integrated circuits, comprising the steps:

a) forming on a silicon wafer, a field effect transistor, having a channel region defined by a source and drain, self-aligned to a gate formed from a first level conductive layer;

b) doping said gate with one or more dopants, including a selected dopant;

c) depositing a first insulating layer, having an upper surface, over said field effect transistor;

d) opening contact windows in said first insulating layer over said source and said drain;

e) depositing a second level conductive layer on said upper surface of first insulating layer thereby filling said contact windows to make a low resistance electrical connection with said source and said drain;

f) said second level conductive layer is etched to define source and drain electrodes;

g) depositing a second insulating layer, having an upper surface;

h) depositing an initial third level conductive layer on said upper surface of said second insulating layer;

i) opening a late programming window in said initial third layer conductive layer over said doped gate;, and j) transporting said selected dopant from said doped gate into said channel region of said field effect transistor.

24. A method as recited in claim 23 further comprising, after step i), the additional step of etching said initial third level conductive layer to create interconnect.

25. A method as recited in claim 23 further comprising, after step i), the additional steps of:

j) stripping said initial third level conductive layer;
k) depositing a final third level conductive layer; and
l) etching said final third level conductive layer to create interconnect.

26. A method as recited in claims 16, 17, 18, 19, 20, 21, 22, 23, 24 or 25 wherein said transporting of said selected dopant from said doped gate into said channel region of said field effect transistor comprises diffusion in the presence of a diffusion enhancer.

27. A method as recited in claim 26 wherein said dopant is of a conductivity type opposite to that of said source and said drain.

28. A method as recited in claims 26 wherein said dopant is the same conductivity type as that of said source and said drain.

29. A method as recited in claim 26 wherein said dopant comprises boron ions.

30. A method as recited in claim 29 wherein said diffusion enhancer comprises hydrogen.

* * * * *

UNITED STATES PATENT AND TRADEMARK OFFICE
CERTIFICATE OF CORRECTION

PATENT NO. : 5,091,328
DATED : February 25, 1992
INVENTOR(S) : William E. Miller It is certified that error appears in the above-identified patent and that said Letters Patent is hereby corrected as shown below:

In col. 11, line 9 delete "t" and substitute "contact".

Signed and Sealed this

First Day of June, 1993

Attest:

MICHAEL K. KIRK

Attesting Officer

Acting Commissioner of Patents and Trademarks